US012763656B2

(12) United States Patent
Scott et al.

(10) Patent No.: US 12,763,656 B2
(45) Date of Patent: Oct. 13, 2026

(54) DYNAMIC CURRENT LIMITS FOR DIRECT CURRENT-TO-DIRECT CURRENT (DC-DC) CONVERTERS

(71) Applicant: Qorvo US, Inc., Greensboro, NC (US)

(72) Inventors: Baker Scott, San Jose, CA (US); Nadim Khlat, Cugnaux (FR); Hui Liu, San Diego, CA (US); George Maxim, Saratoga, CA (US)

(73) Assignee: Qorvo US, Inc., Greensboro, NC (US)

( * ) Notice: Subject to any disclaimer, the term of this patent is extended or adjusted under 35 U.S.C. 154(b) by 300 days.

(21) Appl. No.: 18/627,584

(22) Filed: Apr. 5, 2024

(65) Prior Publication Data

US 2024/0356424 A1 Oct. 24, 2024

Related U.S. Application Data

(60) Provisional application No. 63/460,975, filed on Apr. 21, 2023.

(51) Int. Cl.

| | |
|---|---|
| ***H04B 1/40*** | (2015.01) |
| ***H02M 1/00*** | (2006.01) |
| ***H02M 3/155*** | (2006.01) |
| ***H03F 3/24*** | (2006.01) |
| ***H04B 1/04*** | (2006.01) |

(52) U.S. Cl.
CPC ......... *H02M 1/0003* (2021.05); *H02M 3/155* (2013.01); *H03F 3/245* (2013.01)

(58) Field of Classification Search
CPC .. H02M 1/0003; H02M 3/155; H02M 3/1566; H02M 3/156; H02M 1/0012; H02M 1/0025; H02M 3/157; H03F 3/245; H04B 1/04; H04B 1/16; H04B 1/40
See application file for complete search history.

(56) References Cited

U.S. PATENT DOCUMENTS

| | | | |
|---|---|---|---|
| 7,391,195 | B2 | 6/2008 | Tiew et al. |
| 8,054,058 | B2 | 11/2011 | Liu et al. |
| 8,519,691 | B2 | 8/2013 | McCloy-Stevens |
| 8,773,097 | B2 | 7/2014 | Franklin et al. |
| 9,379,621 | B1 | 6/2016 | Kalyanaranman et al. |
| 9,584,018 | B2 | 2/2017 | Kelin et al. |

(Continued)

OTHER PUBLICATIONS

Extended European Search Report for European Patent Application No. 24170865.0, mailed Sep. 16, 2024, 7 pages.

*Primary Examiner* — Andrew Wendell
(74) *Attorney, Agent, or Firm* — Withrow & Terranova, P.L.L.C.

(57) ABSTRACT

Systems and methods for dynamic current limits for direct current-to-direct current (DC-DC) converters are disclosed. In one aspect, a DC-DC converter (e.g., a buck-boost converter) having dual current and voltage feedback loops is provided. Information from the voltage feedback loop may be used to set a reference level for the current feedback loop. This information may be further based on information from a ramp compensation circuit and a current limiting circuit. The accumulated information may then be combined with another output from the ramp compensation circuit to control the DC-DC converter. The combination of feedback and elements provides an opportunity to sculpt a voltage output of the DC-DC converter to avoid over and undershooting a target output.

17 Claims, 8 Drawing Sheets

(56) References Cited

U.S. PATENT DOCUMENTS

| | | | | |
|---|---|---|---|---|
| 10,090,663 | B2 | 10/2018 | Chen et al. | |
| 11,183,928 | B2 | 11/2021 | Cao | |
| 12,126,307 | B2 * | 10/2024 | Balteanu | H03F 1/0227 |
| 2006/0006854 | A1 * | 1/2006 | Oswald | H02M 3/156 323/282 |
| 2013/0147277 | A1 * | 6/2013 | Popescu-Stanesti | H02J 7/865 307/66 |
| 2014/0097821 | A1 * | 4/2014 | Chen | G05F 1/468 323/293 |
| 2015/0008895 | A1 * | 1/2015 | Weng | H02M 3/156 323/285 |
| 2016/0165536 | A1 * | 6/2016 | Murali | H04W 52/028 370/311 |
| 2018/0083524 | A1 * | 3/2018 | Childs | H02M 3/1588 |
| 2019/0199219 | A1 * | 6/2019 | Ida | H01M 10/48 |
| 2020/0099301 | A1 * | 3/2020 | Itou | H02M 1/36 |
| 2023/0015278 | A1 * | 1/2023 | Fan | G06F 1/26 |
| 2023/0223849 | A1 * | 7/2023 | Li | H02M 1/0025 323/247 |
| 2023/0266782 | A1 * | 8/2023 | Dibbad | G01R 19/16552 327/540 |
| 2024/0339918 | A1 * | 10/2024 | Scott | H02M 3/158 |
| 2025/0266753 | A1 * | 8/2025 | Scott | H02M 3/1584 |

* cited by examiner

DYNAMIC CURRENT LIMITS FOR DIRECT CURRENT-TO-DIRECT CURRENT (DC-DC) CONVERTERS

RELATED APPLICATION

This application claims the benefit of Provisional Patent Application Ser. No. 63/460,975, filed Apr. 21, 2023, the disclosure of which is hereby incorporated herein by reference in its entirety.

BACKGROUND

I. Field of the Disclosure

The technology of the disclosure relates generally to voltage converters such as direct current-to-direct current (DC-DC) converters and providing smooth settling for same.

II. Background

Computing devices abound in modern society, and more particularly, mobile communication devices have become increasingly common. The prevalence of these mobile communication devices is driven in part by the many functions that are now enabled on such devices. Increased processing capabilities in such devices means that mobile communication devices have evolved from pure communication tools into sophisticated mobile entertainment centers, thus enabling enhanced user experiences. With the advent of the myriad functions available to such devices, there has been increased pressure to find ways to reduce power consumption. One way that power consumption has been reduced is to add power management circuits such as average power tracking (APT) or envelope tracking (ET) circuits to power amplifier chains. The power management circuits control supply voltages to match output power levels for power amplifiers in the power amplifier chains, thereby avoiding excessive overhead and making the power amplifier chain more efficient. As wireless standards evolve to have increasingly frequent power level changes, the need for such power management circuits to shift supply voltage levels quickly has also increased. This increased demand placed on the power management circuits provides room for innovation.

SUMMARY

Aspects disclosed in the detailed description include systems and methods for dynamic current limits for direct current-to-direct current (DC-DC) converters. In particular, exemplary aspects of the present disclosure contemplate a DC-DC converter (e.g., a buck-boost converter) having current and voltage feedback loops. Information from the voltage feedback loop may be used to set a reference level for the current feedback loop. This information may be further based on information from a ramp compensation circuit and a current limiting circuit. The accumulated information may then be combined with another output from the ramp compensation circuit to control the DC-DC converter. The combination of feedback and elements provides an opportunity to sculpt a voltage output of the DC-DC converter to avoid over and undershooting a target output.

In this regard, in one aspect, a power management circuit is disclosed. The power management circuit includes a DC-DC converter, an output node coupled to the DC-DC converter, a current feedback circuit associated with the DC-DC converter, a voltage feedback circuit associated with the DC-DC converter, and a comparator coupled to the current feedback circuit and the voltage feedback circuit, where a voltage output from the voltage feedback circuit is used as a reference for a current output of the current feedback circuit, the comparator further configured to provide a feedback signal to the DC-DC converter.

In this regard, in one aspect, a wireless transceiver is disclosed. The wireless transceiver includes transmit circuitry, including a power amplifier and a power management circuit. The power management circuit includes a direct current-to-direct current (DC-DC) converter configured to provide a supply voltage for the power amplifier, an output node coupled to the DC-DC converter, and a current feedback circuit associated with the DC-DC converter. The power management circuit also includes a voltage feedback circuit associated with the DC-DC converter and a comparator coupled to the current feedback circuit and the voltage feedback circuit, where a voltage output from the voltage feedback circuit is used as a reference for a current output of the current feedback circuit, the comparator further configured to provide a feedback signal to the DC-DC converter.

In this regard, in one aspect, a method of controlling a power management circuit. The method includes detecting a voltage at an output node of a direct current-to-direct current (DC-DC) converter and detecting a current proximate the output node. The method also includes modifying a detected voltage with a current limit and a target voltage and using a modified detected voltage as a reference for a current feedback loop.

DETAILED DESCRIPTION

Figure 1:
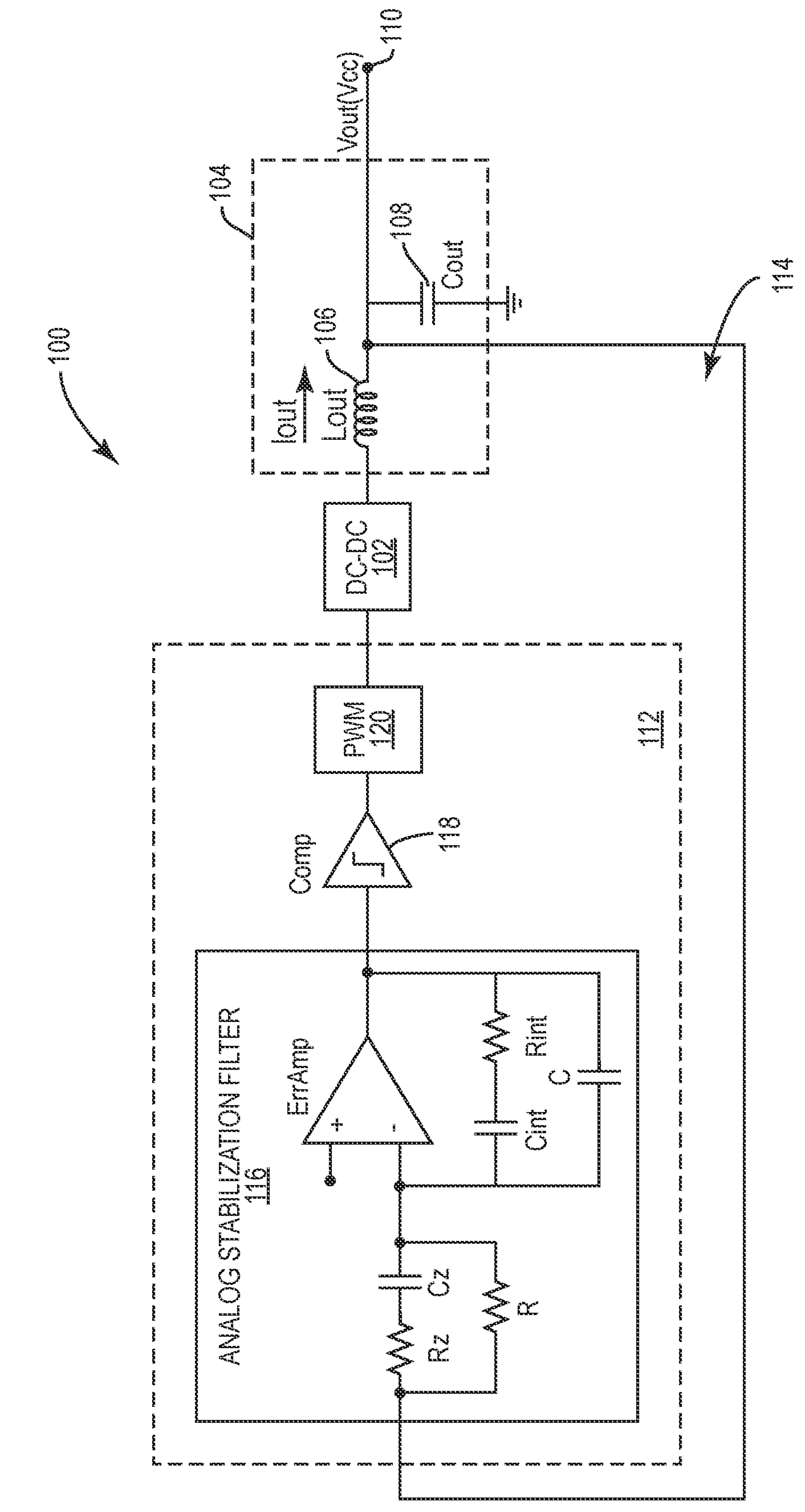
FIG. 1 (RELATED ART)
FIG. 1 is a block diagram of a conventional power management circuit having a stabilization filter and a voltage feedback loop.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that although the terms first, second, etc. may be used herein to describe various elements, these elements should not be limited by these terms. These terms are only used to distinguish one element from another. For example, a first element could be termed a second element, and similarly, a second element could be termed a first element without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element, or intervening elements may also be present. In contrast, when an element is referred to as being "directly on" or extending "directly onto" another element, no intervening elements are present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, no intervening elements are present. It will also be understood that when an element is referred to as being "connected" or "coupled" to another element, it can be directly connected or coupled to the other element, or intervening elements may be present. In contrast, when an element is referred to as being "directly connected" or "directly coupled" to another element, no intervening elements are present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include systems and methods for dynamic current limits for direct current-to-direct current (DC-DC) converters. In particular, exemplary aspects of the present disclosure contemplate a DC-DC converter (e.g., a buck-boost converter) having current and voltage feedback loops. Information from the voltage feedback loop may be used to set a reference level for the current feedback loop. This information may be further based on information from a ramp compensation circuit and a current limiting circuit. The accumulated information may then be combined with another output from the ramp compensation circuit to control the DC-DC converter. The combination of feedback and elements provides an opportunity to sculpt a voltage output of the DC-DC converter to avoid over and undershooting a target output.

Figure 2:
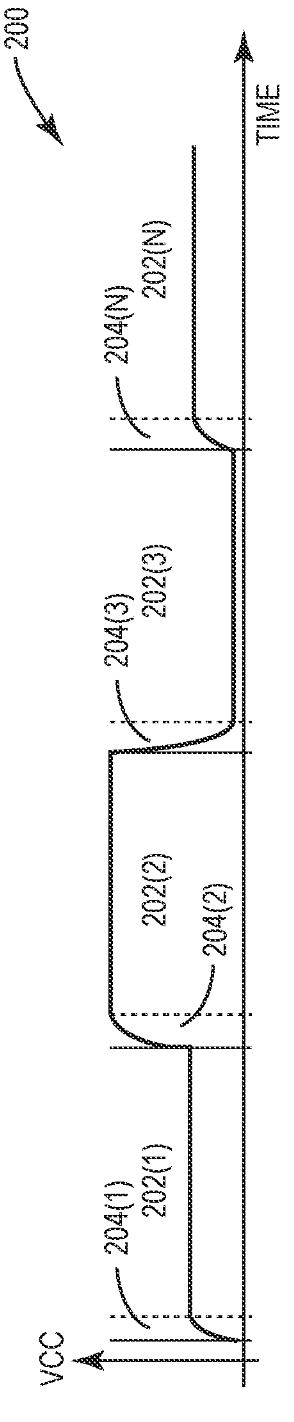
FIG. 2 is a supply voltage versus time graph showing how voltage levels of a power management circuit may need to change based on frame tracking, slot tracking, symbol tracking, or even sub-symbol tracking.

Before addressing exemplary aspects of the present disclosure, a brief description of a conventional power management circuit is provided with reference to FIG. 1, along with a discussion of some of the pressures on such power management circuits created by increased frequency of supply voltage changes illustrated by the graph of FIG. 2. A discussion of exemplary aspects of the present disclosure begins below with reference to FIG. 3A.

In this regard, FIG. 1 is a block diagram of a power management circuit 100 that includes a DC-DC converter 102 and an output filter 104 formed from an inductor 106 and a capacitor 108, although other structures for the output filter 104 are possible. The output filter 104 couples the DC-DC converter 102 to an output node 110. The output node 110 is configured to be coupled to a power amplifier and provide a supply voltage (sometimes referred to as Vout or Vcc) to the power amplifier. The output node 110 may also be coupled to a control circuit 112 through a voltage feedback loop 114.

The control circuit 112 may loosely be considered a stabilization filter 116, a comparator 118, and a pulse width modulation (PWM) circuit 120. The stabilization filter 116 provides a signal to the comparator 118. The comparator 118 is also coupled to a reference voltage (not shown). When the signal from the stabilization filter 116 exceeds the reference voltage, the PWM circuit 120 provides a pulse to the DC-DC converter 102. The pulse width is proportional to a desired supply voltage. For example, wide pulses to the DC-DC converter 102 will cause the DC-DC converter 102 to provide a high voltage and a narrower pulse to provide a lower voltage. Other sorts of state machines or control circuits may be present in place of the PWM circuit 120. Various other elements such as resistor R, resistor Rz, capacitor Cz, resistor Rint, capacitor C, and capacitor Cint may also be present In use, as illustrated by graph 200 in FIG. 2, the power management circuit 100 may have changes in the supply voltage at the output node 110 that provide a steady state voltage for time increments 202(1)-202(N). The time increments 202(1)-202(N) may correspond to frames, slots, symbols, or even sub-symbols of data to be transmitted through an antenna (not shown). In practice, each voltage change between different increments 202(1)-202(N) may be accompanied by a write command to registers in the DC-DC converter 102 that cause the supply voltage to change to the new value. When there is sufficient time, additional information on how to manage the transition optimally may also be written to registers in the DC-DC converter 102. However, as the size of the time increment decreases, the time available to write to the optimization registers decreases, and the time available to settle (e.g., windows 204(1)-204(N)) at the new voltage also decreases. Without the additional information on how to transition, there is a greater chance that the transition may have an undershoot or overshoot, either of which may delay the steady-state operation and negatively impact performance. Likewise, trying to transition quickly may result in high currents, which may exceed tolerance values for the circuitry. Historically, such high currents would result in device shutdown rather than risk damage to the circuitry.

Exemplary aspects of the present disclosure provide a dynamic current limiting circuit that allows for fast transitions between voltage levels as well as preventing over and undershooting during settling at the new voltage level. Initially, the DC-DC converter is controlled by both a voltage feedback loop and a current feedback loop. The voltage feedback loop provides a reference current for the current feedback loop. The voltage feedback loop also receives information from a ramp compensation circuit that knows the state of the DC-DC converter and the target supply voltage. Based on this information, a dynamic current limit circuit may adjust the voltage feedback loop to a desired reference current. Then, as the supply voltage approaches the desired target level, the current limit may be dynamically adjusted back to a level corresponding to normal operation. Rather than merely turning off the device at high currents, aspects of the present disclosure provide a dynamic current profile that allows for optimal level changes without the risk of damaging the circuitry.

Figure 3A:
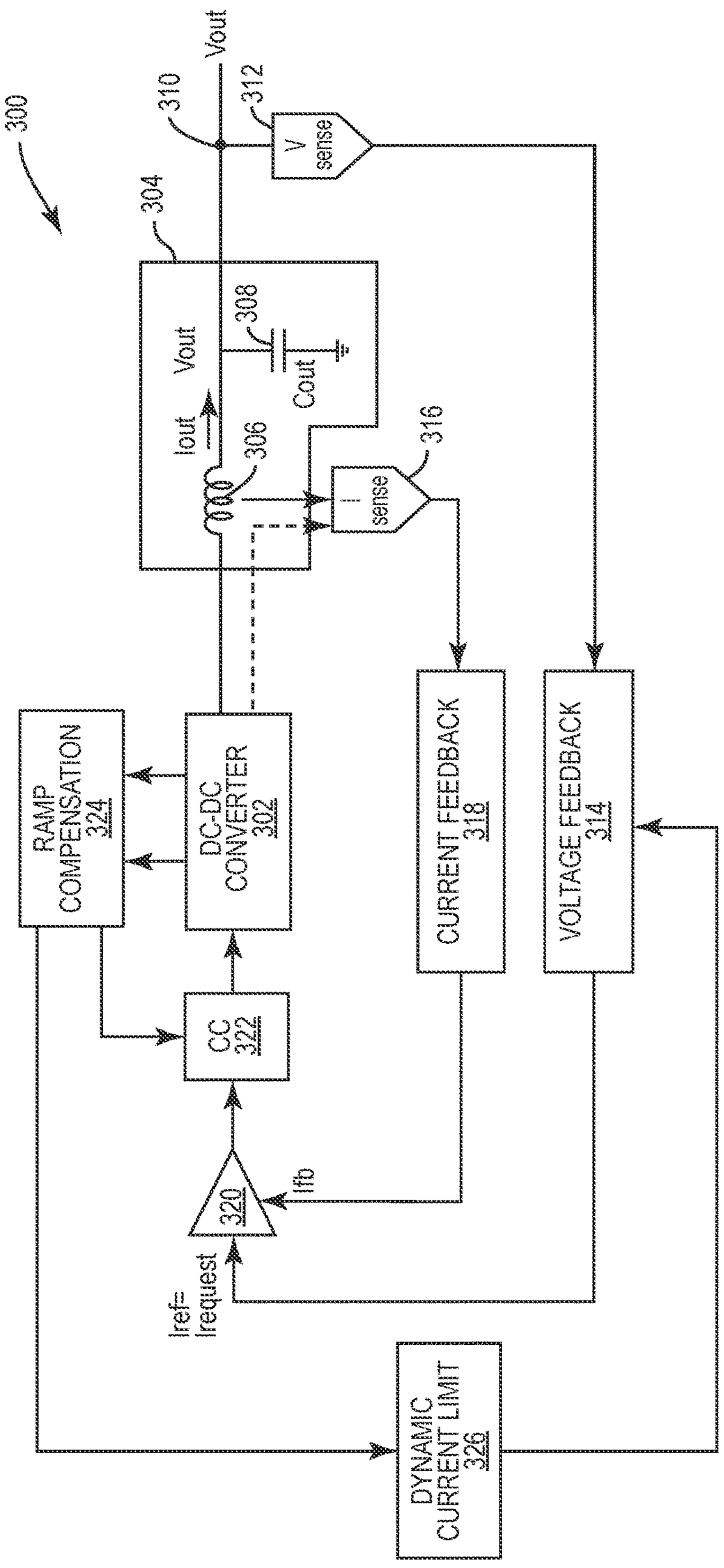
FIG. 3A is a block diagram of an exemplary power management circuit with feedback loops and a dynamic current limit circuit according to aspects of the present disclosure.

In this regard, FIG. 3A provides a block diagram of an exemplary power management circuit 300 according to exemplary aspects of the present disclosure. The power management circuit 300 includes a DC-DC converter 302 and an output filter 304 formed from an inductor 306 (having a current Iout therethrough) and a capacitor 308 (having a capacitance Cout). Again, other filter structures may be used as needed or desired without departing from the present disclosure. The DC-DC converter 302 may be a buck, a buck-boost, or a boost converter as needed or desired. The output filter 304 couples the DC-DC converter 302 to an output node 310. A voltage sensor 312 detects the output voltage at the output node 310 and provides this value or information relating to this value to voltage feedback circuit 314. A current sensor 316 may detect a current across the inductor 306, some other structure in the output filter 304, or from the DC-DC converter 302 and provide this value or information relating to this value to current feedback circuit 318. Values (Iref) from the voltage feedback circuit 314 are compared to values (Ifb) from the current feedback circuit 318 by a summation circuit or comparator 320, where the value from the voltage feedback circuit 314 acts as a reference for the value from the current feedback circuit 318. When the value Ifb is less than the value Iref, the comparator 320 may inject current forward to be provided to the DC-DC converter 302 through a control circuit 322. Alternatively, if a summation circuit is used, the difference between the values provides the current to be injected. It should be appreciated that the current feedback performs cycle-to-cycle corrections while the voltage feedback is substantially slower and more readily able to serve as the reference.

The control circuit 322 also receives input from a ramp compensation circuit 324. The ramp compensation circuit 324 knows information on the state of the DC-DC converter 302 relative to the transition being undertaken. This information is used to set a dynamic current limit in a dynamic current limit circuit 326. The dynamic current limit circuit 326 sets a dynamic current limit based on the target voltage and the state of the transition. This dynamic current limit is provided to the voltage feedback circuit 314, which adjusts Iref based thereon.

Figure 3B:
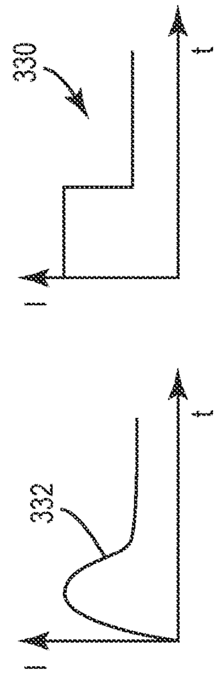
FIG. 3B shows two dynamic current limit curves plotted against time as used by exemplary aspects of the present disclosure.

FIG. 3B provides an example of dynamic current limit profiles 330 and 332 comparing current to time. In both cases, the current limit is initially raised so that Iref is initially high, causing current to be injected rapidly at the comparator 320, but then after transition has reached a certain point, the current limit is adjusted back to a level that supports normal operation. Manipulation of this curve may reduce or eliminate the overshoot or undershoot of the transition. Likewise, the curve may be set such that there is no damage to the circuitry while still allowing the transition to occur in an expedient manner.

Figure 4:
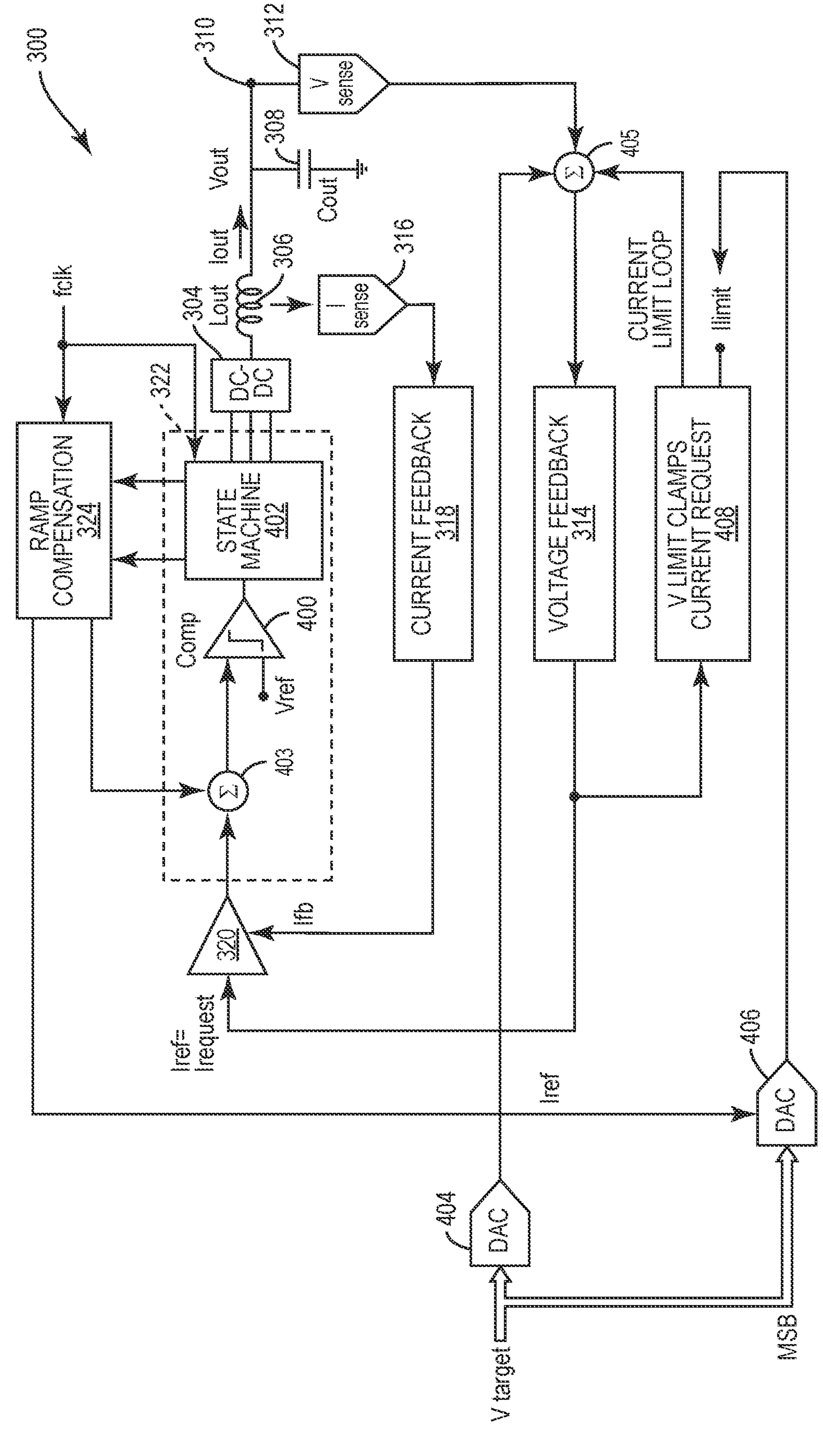
FIG. 4 is a block diagram of the power management circuit of FIG. 3A with additional details about the current limit circuit.

Additional details for the power management circuit 300 are shown in FIG. 4. More specifically, the control circuit 322 is expanded to show a comparator 400 (analogous to the comparator 118) and a state machine 402. The state machine 402 may provide state information to the ramp compensation circuit 324 and receive a clock signal (fclk). The ramp compensation circuit 324 may also receive the clock signal. The control circuit 322 may further include a summation circuit 403 that sums the signal from the ramp compensation circuit 324 with the output of the comparator 320. Additional details are also provided for the voltage feedback loop. Specifically, a target voltage may be supplied, such as from a baseband processor, the DC-DC converter 302, the ramp compensation circuit 324, or other source. This target voltage is provided to a first digital-to-analog converter (DAC) 404 and summed with the sensed voltage from voltage sensor 312 by a summation circuit 405. Additionally, some bits (i.e., the most significant bits (MSB)) are provided to a second DAC 406, which provides a current limit (Ilimit) to a voltage clamp 408. The second DAC 406 also receives Iref from the ramp compensation circuit 324. The value of the voltage clamp 408 is also summed with the sensed voltage from the voltage sensor 312 at the summation circuit 405. The voltage clamp 408 also receives a feedback signal from the voltage feedback circuit 314. This structure provides a current limit loop, where the target voltage and Iref adjust the current limit dynamically.

Figure 5:
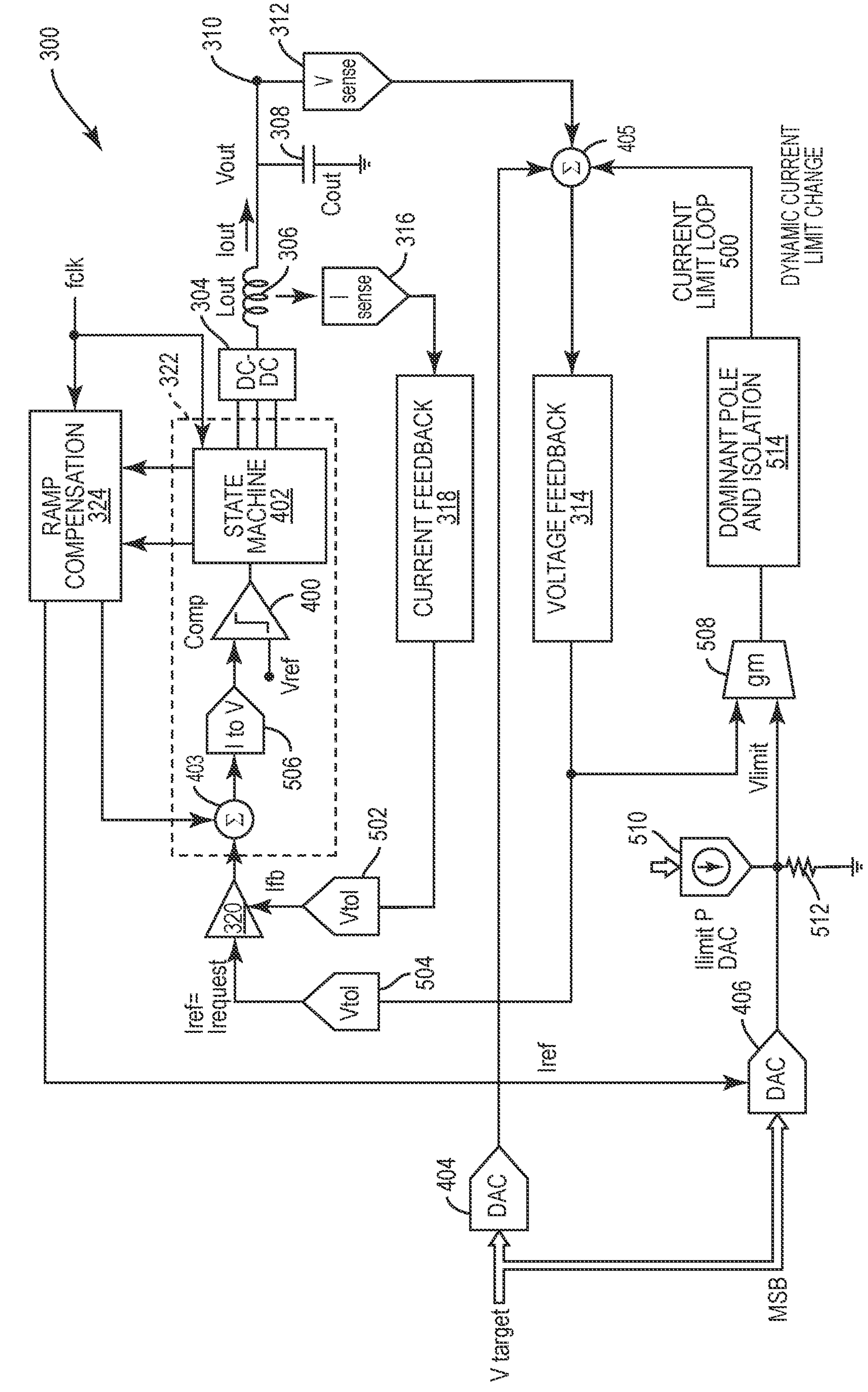
FIG. 5 is a block diagram of the power management circuit of FIG. 3A with additional details about the feedback loops.

FIG. 5 provides other additional details about the power management circuit 300 and, in particular, about the current limit loop 500 as well as explicitly showing voltage-to-current converters 502, 504 that provide currents to the summation circuit or comparator 320 (since currents are easier to sum than voltages). The control circuit 322 may include a voltage-to-current converter 506 so that the comparator 400 may compare voltages more readily. The threshold for the current limit (Ilimit) may be generated as a voltage level (Vlimit) that goes into a reference input of a transconductance circuit 508. The Vlimit can be generated by injecting a current from a DAC 510 into a resistance 512. The DAC 510 allows adjustment to a static component of the current limit. The transconductance circuit 508 is used to close a feedback loop around the voltage feedback circuit 314. A dominant pole circuit 514 may be added to the feedback limiting local loop to provide stable operation of the voltage feedback circuit 314.

Figure 6:
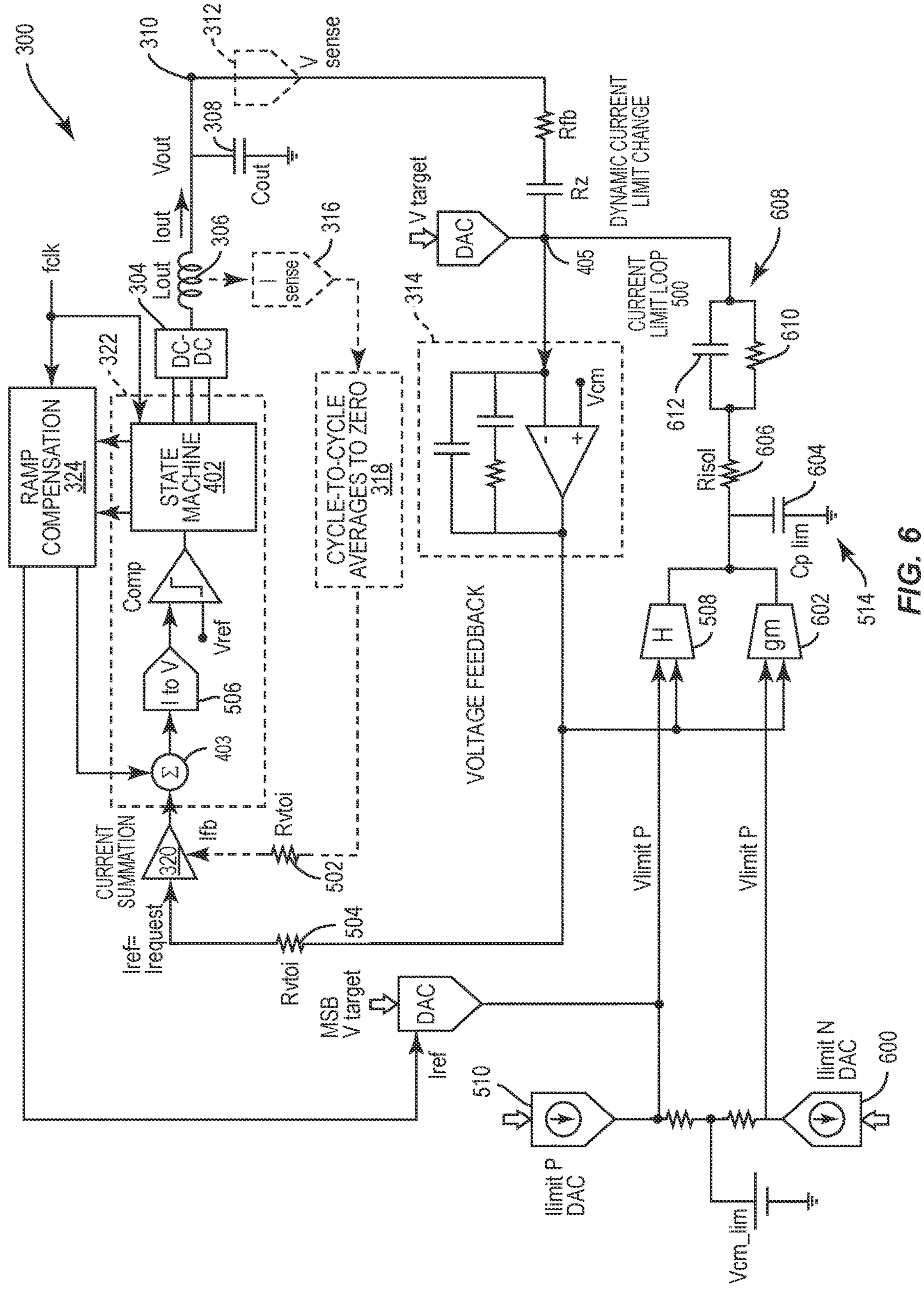
FIG. 6 is a block diagram of the power management circuit of FIG. 3A with additional details about positive and negative side current limiting.

FIG. 6 provides some additional details about the voltage feedback circuit 314 as well as the dominant pole circuit 514. Likewise, it should be appreciated that lower current limits may also be considered to assist in reducing undershoot. Thus, an additional DAC 600 may be provided for the lower current value along with an additional transconductance circuit 602. The dominant pole circuit 514 may act as a clamp and have a dominant pole formed by a capacitor 604. An isolation resistor 606 may help isolate the dominant pole circuit 514, and an additional pole may be formed by resonant circuit 608 to provide stability. The resonant circuit 608 includes a resistor 610 and a capacitor 612.

Figure 7:
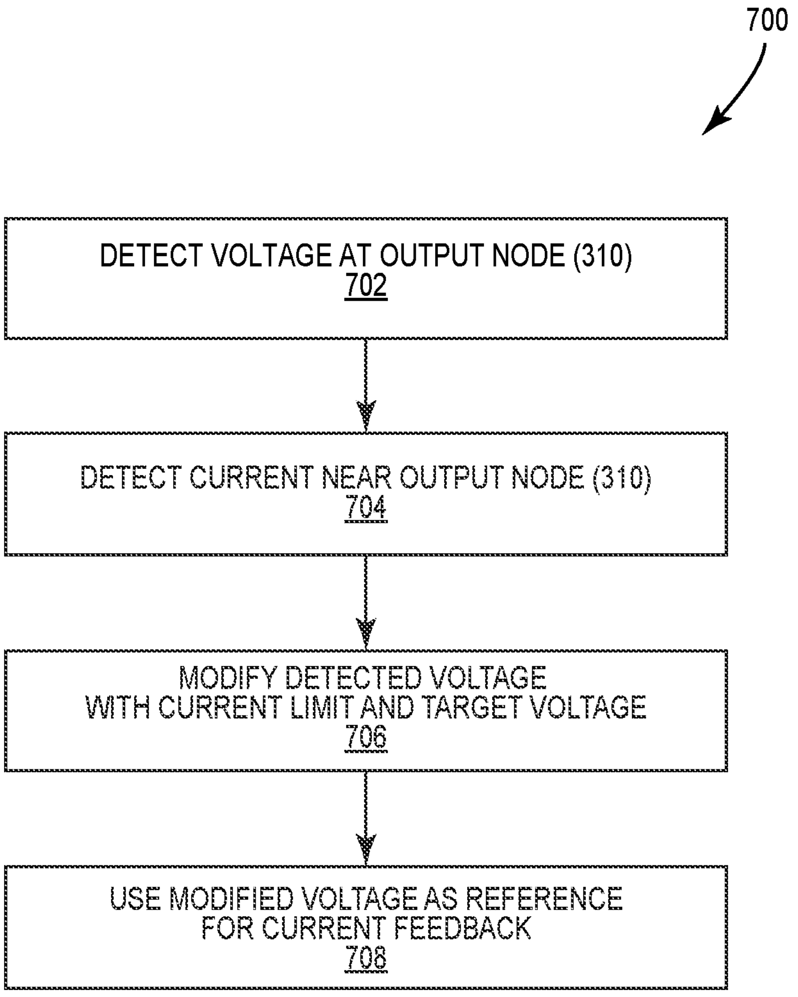
FIG. 7 is a flowchart illustrating an exemplary process for limiting current for a power management circuit to prevent over and undershooting.

An overview of the process 700 of using the power management circuit 300 of the present disclosure is provided in FIG. 7. The process 700 begins by detecting a voltage at the output node 310 (block 702) and detecting a current at or near the output node 310 (block 704). The detected voltage is modified by a current limit and a target voltage (block 706). The modified voltage is used as a reference for a current feedback loop (block 708), where the detected current is compared to the modified voltage to get a correction value for a DC-DC converter 302. It should be appreciated the current limit is based on the ramp compensation circuit 324 and the target voltage.

Figure 8:
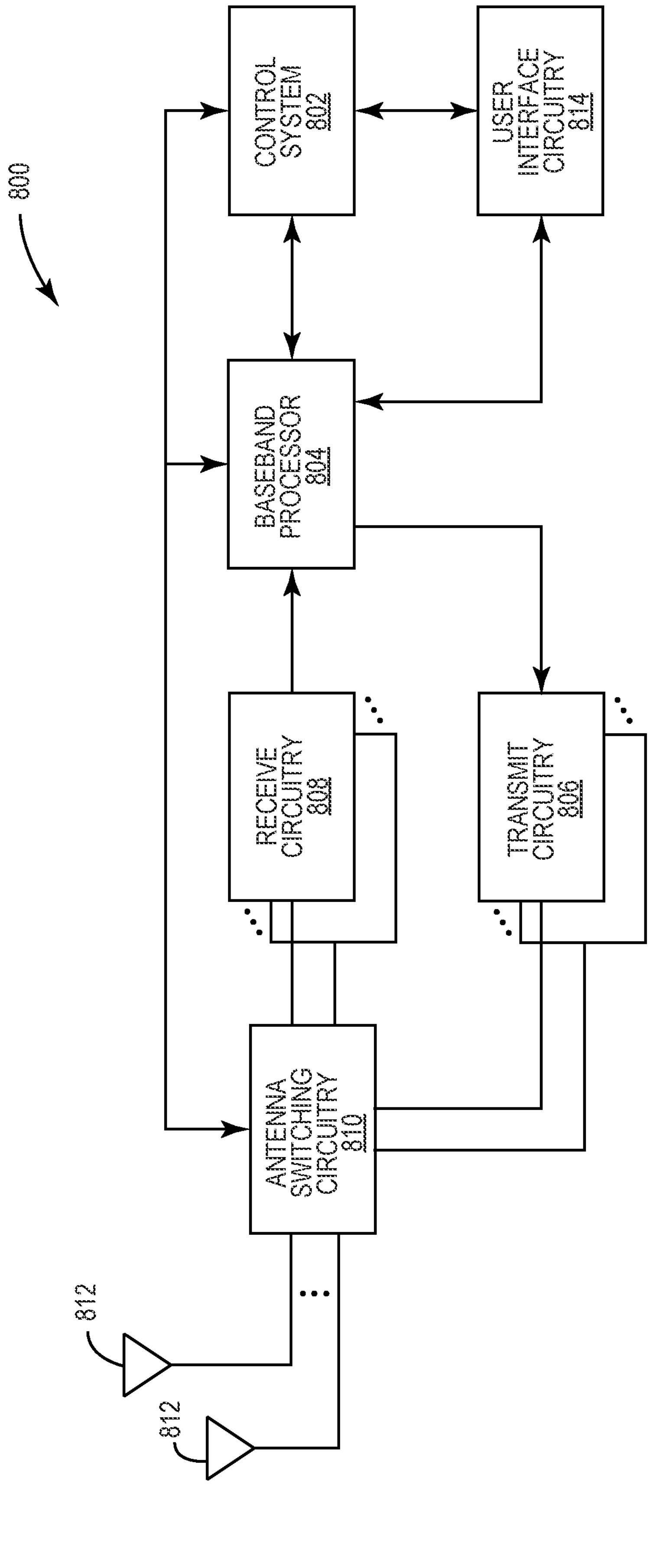
FIG. 8 is a block diagram of a mobile terminal that may include the power management circuit of FIG. 3A.

With reference to FIG. 8, the power management circuits described above may be implemented in various types of user elements 800, such as mobile terminals, smart watches, tablets, computers, navigation devices, access points, and like wireless communication devices that support wireless communications, such as cellular, wireless local area network (WLAN), Bluetooth, and near field communications. The user elements 800 will generally include a control system 802, a baseband processor 804, transmit circuitry 806, which may include the power management circuit 300 of the present disclosure, receive circuitry 808, antenna switching circuitry 810, multiple antennas 812, and user interface circuitry 814. In a non-limiting example, the control system 802 can be a field-programmable gate array (FPGA) or an application-specific integrated circuit (ASIC), as an example. In this regard, the control system 802 can include at least a microprocessor(s), an embedded memory circuit(s), and a communication bus interface(s). The receive circuitry 808 receives radio frequency signals via the antennas 812 and through the antenna switching circuitry 810 from one or more base stations. A low noise amplifier and a filter of the receive circuitry 808 cooperate to amplify and remove broadband interference from the received signal for processing. Downconversion and digitization circuitry (not shown) will then downconvert the filtered, received signal to an intermediate or baseband frequency signal, which is then digitized into one or more digital streams using an analog-to-digital converter(s) (ADC).

The baseband processor 804 processes the digitized received signal to extract the information or data bits conveyed in the received signal. This processing typically comprises demodulation, decoding, and error correction operations. The baseband processor 804 is generally implemented in one or more digital signal processors (DSPs) and ASICs.

For transmission, the baseband processor 804 receives digitized data, which may represent voice, data, or control information, from the control system 802 that it encodes for transmission. The encoded data is output to the transmit circuitry 806, where a digital-to-analog converter(s) (DAC) converts the digitally encoded data into an analog signal, and a modulator modulates the analog signal onto a carrier signal that is at a desired transmit frequency or frequencies. A power amplifier will amplify the modulated carrier signal to a level appropriate for transmission and deliver the modulated carrier signal to the antennas 812 through the antenna switching circuitry 810 to the antennas 812. According to the present disclosure, power management circuits may work with the power amplifier to assist in providing efficient operation of the power amplifier. The multiple antennas 812 and the replicated transmit and receive circuitries 806, 808 may provide spatial diversity. Modulation and processing details will be understood by those skilled in the art.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications, as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

What is claimed is:

1. A power management circuit for managing transitions between supply voltage levels, the power management circuit comprising:

a direct current-to-direct current (DC-DC) converter;

a ramp compensation circuit coupled to the DC-DC converter and configured to provide information relating to a state of the DC-DC converter and a target supply voltage;

an output node coupled to the DC-DC converter;

a dynamic current limit circuit coupled to the ramp compensation circuit and configured to provide a dynamic current value based on the information provided by the ramp compensation circuit;

a current feedback circuit associated with the DC-DC converter;

a voltage feedback circuit associated with the DC-DC converter and configured to receive the dynamic current value from the dynamic current limit circuit and to provide a reference current based on the dynamic current value;

a comparator coupled to the current feedback circuit and the voltage feedback circuit, where the reference current output from the voltage feedback circuit is used as a reference for a current output of the current feedback circuit, the comparator further configured to provide a feedback signal to the DC-DC converter.

2. The power management circuit of claim 1, further comprising an output filter positioned between the output node and the DC-DC converter.

3. The power management circuit of claim 2, further comprising a current sensor configured to sense current in the output filter and provide information relating to sensed current to the current feedback circuit.

4. The power management circuit of claim 1, further comprising a voltage sensor coupled to the output node and configured to provide information relating to sensed voltage to the voltage feedback circuit.

5. The power management circuit of claim 1, wherein the DC-DC converter comprises a buck converter.

6. The power management circuit of claim 1, wherein the DC-DC converter comprises a boost converter.

7. The power management circuit of claim 1, wherein the DC-DC converter comprises a buck-boost converter.

8. The power management circuit of claim 1, wherein the dynamic current limit circuit comprises a digital-to-analog converter (DAC) configured to convert a signal from the ramp compensation circuit to a dynamic current limit change signal.

9. The power management circuit of claim 8, wherein the dynamic current limit circuit comprises a clamp responsive to the dynamic current limit change signal.

10. The power management circuit of claim 8, wherein the dynamic current limit change signal comprises a rectangular step function.

11. The power management circuit of claim 8, wherein the dynamic current limit change signal comprises a rounded pulse shape function.

12. The power management circuit of claim 1, wherein the dynamic current limit circuit is configured to minimize overshoot and undershoot conditions in voltage levels of the DC-DC converter.

13. The power management circuit of claim 1, further comprising a control circuit coupled to the comparator and the DC-DC converter.

14. The power management circuit of claim 13, wherein the control circuit comprises a state machine.

15. A wireless transceiver comprising:

transmit circuitry comprising:

a power amplifier; and a power management circuit comprising:

a direct current-to-direct current (DC-DC) converter configured to provide a supply voltage for the power amplifier;

a ramp compensation circuit coupled to the DC-DC converter and configured to provide information related to a state of the DC-DC converter and a target supply voltage;

an output node coupled to the DC-DC converter;

a dynamic current limit circuit coupled to the ramp compensation circuit and configured to provide a dynamic current value based on the information provided by the ramp compensation circuit;

a current feedback circuit associated with the DC-DC converter;

a voltage feedback circuit associated with the DC-DC converter and configured to receive the dynamic current value from the dynamic current limit circuit and provide a reference current based on the dynamic current value;

a comparator coupled to the current feedback circuit and the voltage feedback circuit, where the reference current output from the voltage feedback circuit is used as a reference for a current output of the current feedback circuit, the comparator further configured to provide a feedback signal to the DC-DC converter.

16. A method for managing transitions between supply voltage levels, the method comprising:

providing, by a ramp compensation circuit coupled to a direct current-to-direct current (DC-DC) converter, information relating to a state of the DC-DC converter and a target supply voltage, an output node being coupled to the DC-DC converter and a current feedback circuit being associated with the DC-DC converter;

providing, by a dynamic current limit circuit coupled to the ramp compensation circuit, a dynamic current value based on the information provided by the ramp compensation circuit;

receiving, by a voltage feedback circuit associated with the DC-DC converter, the dynamic current value from the dynamic current limit circuit and providing a reference current based on the dynamic current value;

using, by a comparator coupled to the current feedback circuit and the voltage feedback circuit, the reference current output from the voltage feedback circuit as a reference for a current output of the current feedback circuit, and providing a feedback signal to the DC-DC converter, wherein the dynamic current value is initially determined at transition and subsequently adjusted back to a level that supports normal operation.

17. The method of claim 16, wherein the current limit is based on a signal from a ramp compensation circuit.

* * * * *